United States Patent [19]
Gradinariu

[11] Patent Number: 5,872,464
[45] Date of Patent: Feb. 16, 1999

[54] INPUT BUFFER WITH STABILIZED TRIP POINTS

[75] Inventor: Julian C. Gradinariu, Colorado Springs, Colo.

[73] Assignee: Cypress Semiconductor Corp., San Jose, Calif.

[21] Appl. No.: 696,008

[22] Filed: Aug. 12, 1996

[51] Int. Cl.$^6$ .............................................. H03K 19/0185
[52] U.S. Cl. .................................. 326/71; 326/34; 326/83
[58] Field of Search .......................... 326/21, 68, 31–34, 326/71, 121, 82–83; 327/530, 538

[56] References Cited

U.S. PATENT DOCUMENTS

| | | | |
|---|---|---|---|
| 4,242,604 | 12/1980 | Smith | 326/34 |
| 4,736,123 | 4/1988 | Miyazawa et al. | 326/33 |
| 4,797,580 | 1/1989 | Sunter | 326/33 X |
| 5,019,729 | 5/1991 | Kimura et al. | 326/33 X |
| 5,111,081 | 5/1992 | Atallah | 326/34 |
| 5,268,599 | 12/1993 | Matsui | 326/33 |
| 5,321,319 | 6/1994 | Mahmood . | |
| 5,355,033 | 10/1994 | Jang | 326/83 |
| 5,408,191 | 4/1995 | Han et al. | 326/33 |
| 5,481,179 | 1/1996 | Keeth | 323/315 |
| 5,525,933 | 6/1996 | Matsuki et al. | 327/309 |
| 5,554,942 | 9/1996 | Herr et al. | 326/33 |
| 5,589,783 | 12/1996 | McClure | 326/71 |
| 5,610,550 | 3/1997 | Furutani | 327/543 |
| 5,644,254 | 7/1997 | Boudry | 326/62 |

*Primary Examiner*—Jon Santamauro
*Attorney, Agent, or Firm*—Maiorana & Acosta, P.C.; Christopher P. Maiorana

[57] ABSTRACT

The present invention provides a circuit and method using a floating PMOS transistor connected in series between the transistors of an input invertor. The floating PMOS transistor may be used to control the amount of current through the transistors. The gate of the floating PMOS transistor may be connected through a reference line to a duplicate of the input inverter stage. The duplicate stage is generally located in a reference block and fed with a stabilized reference voltage. Each couple (formed by the buffers input stage and the duplicate stage) functions as a differential comparator, which checks the input voltage against the reference voltage and rejects the power supply voltage variations which are perceived as a common-mode noise signal. The supply current is fixed by the reference voltage which reduces power consumption at high input voltages and high supply voltages.

22 Claims, 3 Drawing Sheets

INPUT BUFFER WITH STABILIZED TRIP POINTS

FIELD OF THE INVENTION

The present invention relates to input buffers generally and, more particularly to an input buffer with stabilized trip points.

BACKGROUND OF THE INVENTION

Input buffers often use a CMOS inverter optimized for TTL input levels. A nominal supply voltage is used at the input stage of the input buffer. As a result, the trip points strongly depend on the supply voltage, which causes increased propagation delays at low and high supply voltages. The current consumed by the previous approach, when operating at high supply voltages and high input levels, is higher than desirable for modern integrated circuit (IC) applications.

Input buffers are often designed to accommodate both TTL and CMOS input levels and to switch as fast as possible for a wide range of input rise/fall times. The input stage of such input buffers has a CMOS inverter with the PMOS pull up transistor of the inverter operating in the linear-saturated region throughout the standard TTL (i.e., 0–3 volt) input range. As the input supply voltage Vcc increases, the pull up current also increases, which results in a shift up of the trip point and consequently of the switching input level. As a result, longer propagation delays on the input rising edge and shorter propagation delay on the trailing edge are seen as the input supply voltage Vcc increases. Since the longest of these delays is taken as overall propagation delay, the result is a speed drop at both low and high input supply voltages Vcc.

SUMMARY OF THE INVENTION

The present invention provides a circuit and method using a floating PMOS transistor connected in series between the transistors of an input inverter. The floating PMOS transistor may be used to control the amount of current through the transistors. The gate of the floating PMOS transistor may be connected through a reference line to a duplicate of the input inverter stage. The duplicate stage is generally located in a reference block and fed with a stabilized reference voltage. Each couple (formed by the buffers input stage and the duplicate stage) functions as a differential comparator, which checks the input voltage against the reference voltage and rejects the power supply voltage variations which are perceived as a common-mode noise signal. The supply current is generally fixed by the reference voltage which reduces power consumption at high input voltages and high supply voltages.

The objects, features and advantages of the present invention include an input buffer having one or more stabilized trip points comprising the present circuit, and a method of controlling and/or reducing circuit and/or power consumption in an integrated circuit using a floating PMOS transistor and reference circuit. The present invention provides a substantial speed over conventional input buffer circuits at both low and high supply voltages, which greatly reduces propagation delays and access time push-outs. The present invention also reduces power consumption at high supply voltages and toggling input voltages.

BRIEF DESCRIPTION OF THE DRAWINGS

These and other objects, features and advantages of the present invention will be apparent from the following detailed description and appended claims and drawings in which:

DETAILED DESCRIPTION OF THE PREFERRED EMBODIMENTS

Figure 1:
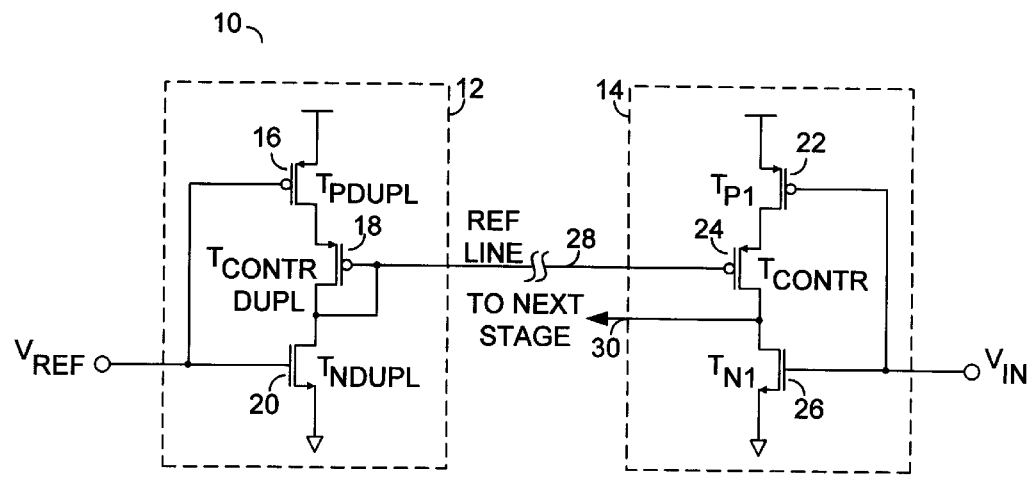
FIG. 1 is a circuit diagram of a preferred embodiment of the present invention.

Referring to FIG. 1, an input buffer circuit 10 is shown in accordance with a preferred embodiment of the present invention. The input buffer 10 generally comprises a first section 12 and a second section 14. The first section 12 generally comprises a transistor 16, a transistor 18 and a transistor 20. The second section 14 generally comprises first transistor 22, a transistor 24 and a transistor 26. The source/drain terminal of the transistor 16 may be connected to an input supply voltage Vcc. The source/drain terminal of the transistor 16 may be connected to the source/drain terminal of the transistor 18. The gate of the transistor 18 may be connected to the source/drain terminal of the transistor 18 as well as to a reference line 28. The reference line 28 is generally connected to the second section 14. The source/drain terminal of the transistor 18 may be connected to the source/drain terminal of the transistor 20. The source/drain terminal of the transistor 20 may be connected to ground. The gates of the transistor 16 and 20 may be coupled together and may receive a reference voltage Vref.

The transistor 22 has a source/drain terminal that may receive an input supply voltage Vcc. The transistor 22 has a gate that may be coupled to the gate of the transistor 26 as well as to an input voltage Vin. The source/drain terminal of the transistor 22 may be coupled to the source/drain terminal of the transistor 24. The gate of the transistor 24 may be coupled to the reference line 28. The source/drain terminal of the transistor 24 may be coupled to the source/drain terminal of the transistor 26. The source/drain terminal of the transistor 26 may be coupled to ground. An output 30 is generally coupled to the next stage of the input buffer 10 and may be connected between the source/drain terminal of the transistor 24 and the source/drain terminal of the transistor 26.

In a typical design application, the input buffer 10 stabilizes the input switching levels versus the variations in the input supply voltage Vcc by using a floating PMOS transistor (i.e transistor 24) connected in series between the transistor 22 and the transistor 26 of the second section 14 to control the current received by the transistors 22 and 26. The gate of the floating PMOS transistor 24 is generally connected through the reference line 28 to a duplicate of the stage, which may be located in a reference block (i.e the first section 12) and may receive a stabilized reference voltage Vref.

The reference line 28 controls a block of eight of the sections 14. Each input buffer 10, formed by the first section 12 (acting as a duplicate stage) and the second section 14 (acting as an input buffer stage), acts as a differential comparator, which may check the input voltage Vin against the reference supply voltage Vref. For a TTL input level, the reference voltage Vref is generally defined by the following equation 1:

$$Vref = \tfrac{1}{2}(Vih+Vil) = \tfrac{1}{2}(2.2+0.8) = 1.5 \text{ volt} \qquad \text{EQ1}$$

where Vih represents the input high and Vil represents the input low in, for example, a standard TTL configuration.

Figure 2:
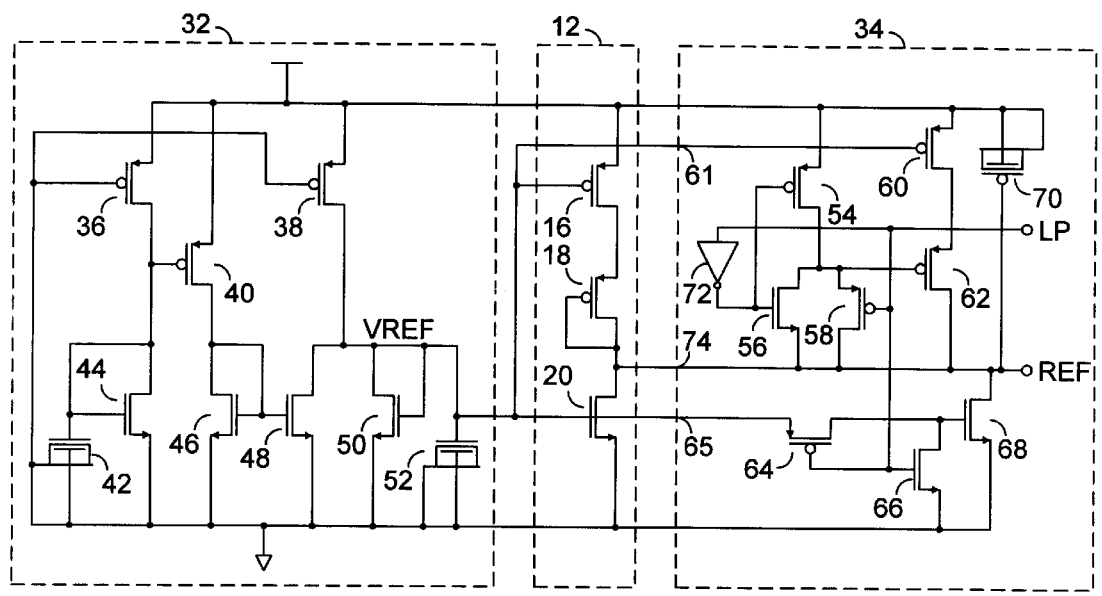
FIG. 2 is a detailed circuit diagram of a preferred embodiment of a reference block of the present invention.

Referring to FIG. 2, a more detailed diagram of the first section 12 is shown. The first section 12 further comprises a reference voltage generating circuit 32 and an output circuit 34. The reference voltage generating circuit 32 generally comprises a transistor 36, a transistor 38, a transistor 40, a transistor 42, a transistor 44, a transistor 46, a transistor 48, a transistor 50 and a transistor 52. The source/drain terminals of the transistors 36, 38 and 40 may be connected to an input supply voltage Vcc. The gate of the transistor 36, the gate of the transistor 38, the source/drain terminal of the transistor 42, the source/drain terminal of the transistor 42, the source/drain terminal of the transistor 44, the source/drain terminal of the transistor 46, the source/drain terminal of the transistor 48, the source/drain terminal of the transistor 50, the source/drain terminal of the transistor 52 and the source/drain terminal of the transistor 52 may be coupled to ground. The source/drain terminal of the transistor 36 may be coupled to the gate of the transistor 40, the gate of transistor 42 and to the source/drain terminal and gate of the transistor 44. The source/drain terminal of the transistor 40 may be coupled to the source/drain terminal of the transistor 46, the gate of the transistor 46 and the gate of the transistor 48. The source/drain terminal of the transistor 38 may be coupled to the source/drain terminal of the transistor 48, the gate of the transistor 52 and the source/drain terminal and gate of the transistor 50. The gate and source/drain terminal of the transistor 50, as well as the gate of the transistor 52 form a common node that represents the reference voltage Vref that is generally presented to the first section 12.

The output circuit 34 generally comprises a transistor 54, a transistor 56, a transistor 58, a transistor 60, a transistor 62, a transistor 64, a transistor 66, a transistor 68, a transistor 70 and an inverter 72. The source/drain terminal of the transistor 54, the source/drain terminal of the transistor 60, the source/drain terminal of the transistor 70 and the source/drain terminal of the transistor 70 may be coupled to an input supply voltage Vcc. The gate of the transistor 54 may be coupled to the gate of the transistor 56 as well as to the output of inverter 72. The source/drain terminal of the transistor 54 may be coupled to the source/drain terminal of the transistor 56, the source/drain terminal of the transistor 58 and the gate of the transistor 62. The source/drain terminal of the transistor 56 and the source/drain terminal of the transistor 58 may be coupled together and may be connected to the source/drain terminal of the transistors 68 and the source/drain terminal of the transistor 62 to provide an output REF. The output REF may also be coupled to the first section 12 through an output 74. The source/drain terminal of the transistor 64 may receive signal from an input 65 that may be received from the first section 12. The source/drain terminal of the transistor 64 may be coupled to the source/drain terminal of the transistor 66 as well as to the gate of the transistor 68. The gate of the transistor 64 may be coupled to the gate of the transistor 66, the gate of the transistor 58 and the input of inverter 72 to present an input LP. The source/drain terminal of the transistor 62 may also be coupled to the output REF and to the gate of the transistor 70. The source/drain terminal of the transistor 62 may be coupled to the source/drain terminal of the transistor 60. The gate of the transistor 60 may receive a signal from an input 61 that may be received from the first section 12.

A power down mode may be implemented by pulling up the gate of the floating PMOS transistor 24 to a high voltage after disconnecting the gate from the reference line 28. A similar pulling up of the gate of the transistor 18 in the first section 12 may also be necessary to power down the input buffer 10. The current consumption of the reference block during power down may be as low as 300 µA. During a power down, a ten times scaled-down first section 12 in the reference block remains active, allowing the reference line 28 to avoid floating during power down. The reference voltage generating circuit 32 employs a single negative feedback configuration which features a minimum of start up problems and a good power supply rejection ratio (PSRR) and tracking of the Vss noise. While the reference voltage generating circuit 32 provides an example of a circuit for generating a reference voltage Vref, other circuits may be used to fit the design criteria of a particular application. Specifically, the temperature stability (i.e., Tc=−2.2 mV/°C.) may be adjusted as necessary.

Figure 3:
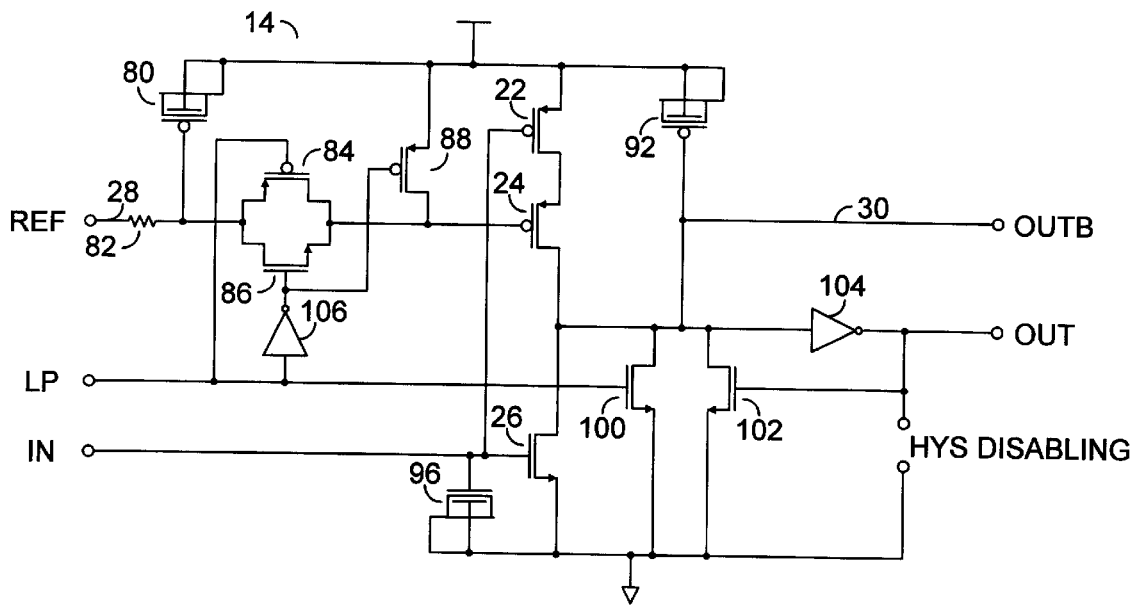
FIG. 3 is a detailed circuit diagram of a preferred embodiment of a duplicate stage of the present invention.

Referring to FIG. 3, a more detailed schematic of the second section 14 incorporating the low power input LP is shown. The second section 14 generally comprises a transistor 80, a resistor 82, a transistor 84, a transistor 86, a transistor 88, the transistor 22, a transistor 92, the floating PMOS transistor 24, a transistor 96, the transistor 26, a transistor 100, a transistor 102, an inverter 104 and an inverter 106. The reference line 28 is generally connected to the resistor 82 which may be connected to the gate of the transistor 80, the source/drain terminal of the transistors 84 and the source/drain terminal of transistor 86. The two source/drain terminals of the transistor 80 are coupled together and may receive the input supply voltage Vcc. The source/drain terminal of the transistor 88, the source/drain terminal of the transistor 22 and the two source/drain terminals of the transistor 92 may also be coupled to the input supply voltage Vcc. The gate of the transistor 84 may be coupled to the input LP as well as to the input of inverter 106 and the gate of the transistor 100. The input LP provides a means for placing the second section 14 into a low power mode by disabling the floating PMOS transistor 24. The source/drain terminal of the transistor 84 and the source/drain terminal of the transistor 86 may be coupled to the source/drain terminal of the transistor 88 as well as to the gate of the floating PMOS transistor 24. The source/drain terminal of the floating PMOS transistor 24 may be coupled to the source/drain terminal of the transistor 26. The gate of the transistor 92 is generally coupled to the source/drain terminal of the transistor 24, the source/drain terminal of the transistor 100, the source/drain terminal of the transistor 102 and may be presented to the input of inverter 104. The gate of the transistor 92 presents the output OUTB. The inverter 104 presents an output OUT. The gate of the transistor 102 is generally also coupled to the output OUT. The source/drain terminals of the transistors 96, 26, 100 and 102 are generally coupled to ground. The two source/drain terminals of the transistor 96 are generally coupled together.

The transistor 102 and the inverter 104 may provide a hysteresis option in the final stage of the input buffer 10. The transistor 80 and the resistor 82 may provide filtering of the reference line 28.

Figure 4:
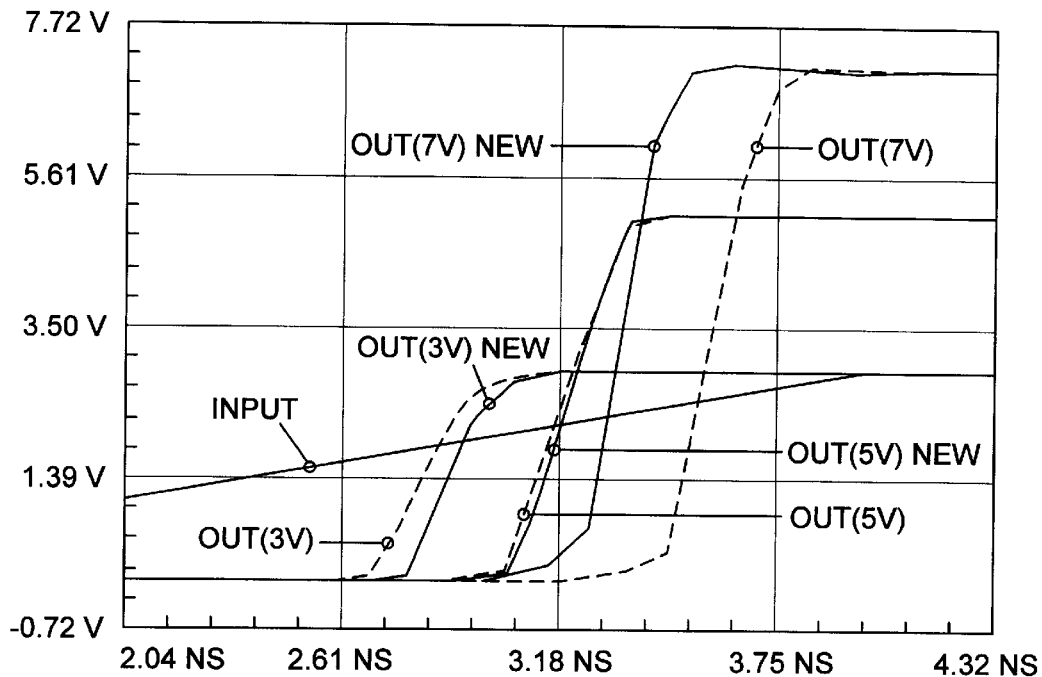
FIG. 4 is a diagram illustrating the rise times of an exemplary circuit of the present invention as compared to a previous approach circuit containing a CMOS inverter.

Referring to FIG. 4, a diagram illustrating the rise times of the input buffer 10 as compared to an otherwise identical circuit substituting a CMOS inverter for the floating PMOS transistor and reference "mirror" circuit is shown. Three voltage traces (i.e 3V, 5V and 7V) are shown. Each trace shows both the previous approach and the present invention labeled as, for example, OUT 3V (for the previous approach) and OUT 3V NEW (for the present invention).

Figure 5:
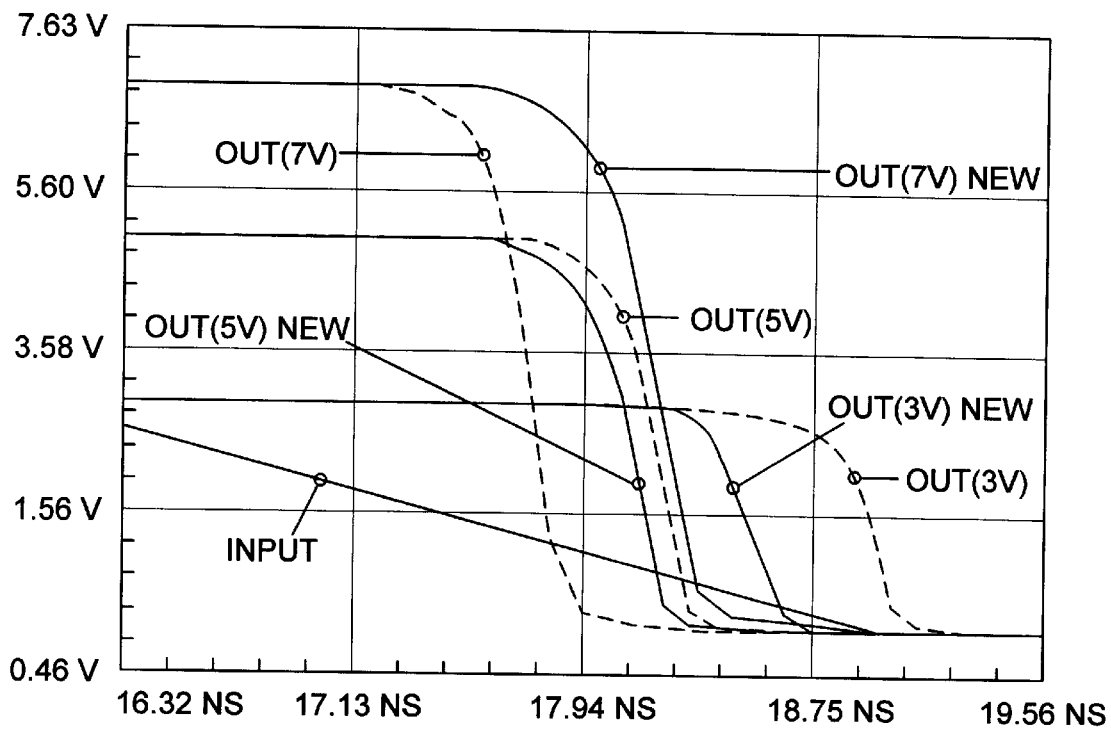
FIG. 5 is a diagram illustrating the fall times of the present invention as compared to the circuit containing the CMOS inverter.

Referring to FIG. 5, a diagram illustrating the fall times of the input buffer 10 as compared to the previous approach is shown. Similar to FIG. 4, three voltage traces (i.e 3V, 5V and 7V) are shown. Each trace shows both the previous approach and the present invention labeled as, for example, OUT 7V (for the previous approach) and OUT 7V NEW (for the present invention).

The following TABLE 1 provides a tabular summary of the rise and fall times over various operating voltages of the previous approach shown in FIG. 4 and FIG. 5:

TABLE 1

| Vcc | 3 V | 5 V | 7 V |
| --- | --- | --- | --- |
| tplh | 337 ps | 693 ps | 1.09 ns |
| tphl | 1.42 ns | 667 ps | 250 ps |

Tplh represents the low to high level propagation delay (i.e the time necessary for the transition between a low state and a high state). Tphl represents the high to low level propagation delay (i.e the time necessary for the transition between a high state and a low state).

The following TABLE 2 provides a tabular summary of the rise and fall times over various operating voltages of the input buffer 10 as shown in FIG. 4 and FIG. 5:

TABLE 2

| Vcc | 3 V | 5 V | 7 V |
| --- | --- | --- | --- |
| tplh | 405 ps | 705 ps | 848 ps |
| tphl | 1.00 ns | 563 ps | 647 ps |

When comparing the propagation delay times of the circuit 10 to the previous approach, the longest propagation delay on either the rising edge or the falling edge generally controls the overall performance. For example, the rising edge delay for the 3V trace for the previous approach is generally 337 ps while the rising edge delay for the circuit 10 is generally 405 ps. However, these rising edge delays have no significance because the falling edge delays are longer in both the previous approach, which is generally shown as 1.42 ns, and the circuit 10, which is generally shown as 1.00 ns. The circuit 10 provides an improvement of (i.e shorter delay) 0.42 ns or 420 ps. As a result the overall delay is generally decreased, which generally provides a performance enhancement over the previous approach.

Figure 6:
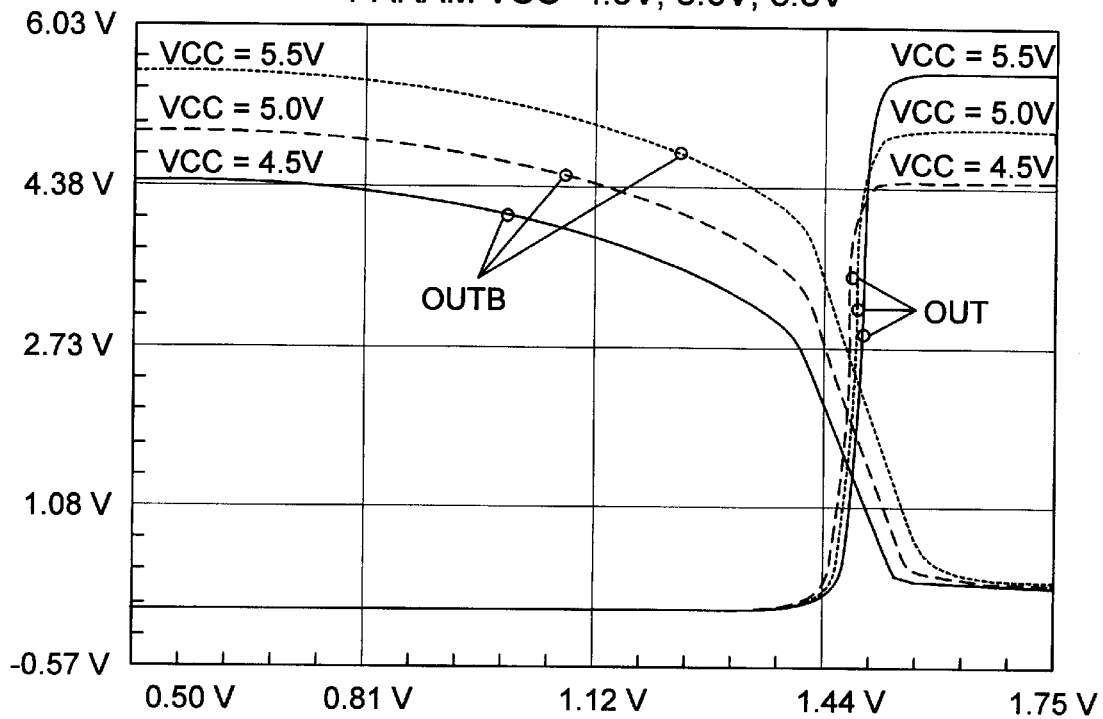
FIG. 6 is a diagram illustrating the trip and switch of the present invention.

Referring to FIG. 6, a diagram illustrating the trip and switch of the present invention is shown. Three voltage traces (i.e 4.5V 5.0V and 5.5V) are shown.

While the invention has been particularly shown and described with reference to preferred embodiments thereof, it will be understood by those skilled in the art that various changes in form and details may be made without departing from the spirit and scope of the invention.

What is claimed is:

1. A circuit comprising:
   a first circuit comprising a first transistor, a second transistor coupled to said first transistor, and a third transistor coupled to said second transistor, said first circuit configured to provide a first reference signal in response to a reference voltage and a first supply voltage;
   a second circuit configured to provide a second reference signal in response to said first supply voltage, a second supply voltage and an input voltage, said second circuit comprising a fourth transistor, a fifth transistor and a sixth transistor, wherein each of said fourth transistor and said fifth transistor receives said input voltage, said fourth transistor is coupled to each of said first supply voltage and a first source/drain terminal of said sixth transistor, said fifth transistor is coupled to each of said second supply voltage and a second source/drain terminal of said sixth transistor, and a gate of said sixth transistor receives said first reference signal; and
   a third circuit configured to provide an output signal in response to said first and second reference signals.

2. The circuit according to claim 1 wherein said second circuit further comprises a plurality of transistors coupled to each other.

3. The circuit according to claim 1 further comprising a fourth circuit configured to generate said reference voltage.

4. The circuit according to claim 3 wherein said fourth circuit comprises a plurality of transistors coupled to each other.

5. An input buffer comprising the circuit of claim 1.

6. A static random access memory (SRAM) comprising the input buffer of claim 5.

7. An input buffer comprising a plurality of circuits according to claim 1.

8. The input buffer according to claim 7 further comprising an input buffer output provided in response to a cascaded combination of each of said output signals.

9. The circuit according to claim 4 wherein said fourth and fifth transistors comprise PMOS transistors and said sixth transistor comprises an NMOS transistor.

10. The input buffer circuit of claim 1, wherein said first transistor receives said reference voltage and is coupled to each of said first supply voltage, a first source/drain terminal of said second transistor and a gate of said second transistor.

11. The input buffer of circuit of claim 10, wherein said third transistor receives said reference voltage and is coupled to each of said second supply voltage and a second source/drain terminal of said second transistor.

12. The input buffer circuit of claim 10, wherein said second circuit comprises a fourth transistor, a fifth transistor and a sixth transistor, each of said fourth transistor and said fifth transistor receives said input signal, said fourth transistor is coupled to each of said first supply voltage and a first source/drain terminal of said sixth transistor, said fifth transistor is coupled to each of a second supply voltage and a second source/drain terminal of said sixth transistor, and a gate of said sixth transistor receives said reference signal.

13. The input buffer circuit of claim 11, wherein said second circuit comprises a fourth transistor, a fifth transistor and a sixth transistor, each of said fourth transistor and said fifth transistor receives said input signal, said fourth transistor is coupled to each of said first supply voltage and a first source/drain terminal of said sixth transistor, said fifth transistor is coupled to each of a second supply voltage and a second source/drain terminal of said sixth transistor, and a gate of said sixth transistor receives said reference signal.

14. An input buffer circuit comprising:
   a first circuit comprising (i) a first transistor that receives a reference voltage and is coupled to a first supply voltage, (ii) a second transistor having a first source/drain terminal and a gate coupled to said first transistor, and (iii) a third transistor that receives said reference voltage and is coupled to each of a second supply voltage and a second source/drain terminal of said second transistor, said first circuit configured to generate said reference signal in response to a reference voltage and said first supply voltage; and a second circuit configured to generate an output signal in response to said reference signal, a second supply voltage and an input signal, said first and second supply voltages being the same or different.

15. The circuit according to claim 14 wherein said first circuit further comprises a fourth transistor, a fifth transistor and a sixth transistor coupled to each other.

16. The input buffer circuit according to claim 14 wherein said second circuit further comprising a fourth transistor, a fifth transistor coupled to said fourth transistor and a sixth transistor coupled to said fifth transistor, at least one of said fourth transistor and said sixth transistor receiving said input signal and being coupled to one of said first and second supply voltages.

17. The input buffer according to claim 14 further comprising an inverter configured to generate an output in response to said output signal.

18. A static random access memory (SRAM) comprising the input buffer of claim 14.

19. The input buffer circuit of claim 16, wherein each of said fourth transistor and said fifth transistor receives said input signal, said fourth transistor is coupled to each of said first supply voltage and a first source/drain terminal of said sixth transistor, said fifth transistor is coupled to each of said second supply voltage and a second source/drain terminal of said sixth transistor, and a gate of said sixth transistor receives said reference signal.

20. A method for improving the response time of an input buffer comprising:

generating a first reference signal from first and second PMOS transistors and an NMOS transistor in response to a reference voltage and a supply voltage, wherein said first PMOS transistor receives said reference voltage and is coupled to each of said supply voltage, a first source/drain terminal of said second PMOS transistor and a gate of said second PMOS transistor and said NMOS transistor receives said reference voltage and is coupled to each of said supply voltage and a second source/drain terminal of said second PMOS transistor;

generating a second reference signal in response to said first reference signal, said supply voltage and an input voltage; and generating an output signal in response to said first and second reference signal.

21. The method according to claim 20 further comprising:

generating said second reference signal in response to (i) a second NMOS transistor and (ii) third and fourth PMOS transistors.

22. The method of claim 21, wherein each of said fifth and third PMOS transistors is coupled to said first supply voltage, and each of said second and fourth PMOS transistors receives said reference signal.

* * * * *